United States Patent
Zhao et al.

(10) Patent No.: US 11,515,427 B2
(45) Date of Patent: Nov. 29, 2022

(54) PRECISE BOTTOM JUNCTION FORMATION FOR VERTICAL TRANSPORT FIELD EFFECT TRANSISTOR WITH HIGHLY DOPED EPITAXIAL SOURCE/DRAIN, SHARP JUNCTION GRADIENT, AND/OR REDUCED PARASITIC CAPACITANCE

(71) Applicant: International Business Machines Corporation, Armonk, NY (US)

(72) Inventors: Kai Zhao, Albany, NY (US); Shahab Siddiqui, Clifton Park, NY (US); Daniel James Dechene, Watervliet, NY (US); Rishikesh Krishnan, Cohoes, NY (US); Charlotte DeWan Adams, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/901,852

(22) Filed: Jun. 15, 2020

(65) Prior Publication Data
US 2021/0391473 A1     Dec. 16, 2021

(51) Int. Cl.
*H01L 29/78*     (2006.01)
*H01L 29/786*    (2006.01)
(Continued)

(52) U.S. Cl.
CPC ............ *H01L 29/78642* (2013.01); *H01L 21/823418* (2013.01); *H01L 29/0847* (2013.01);
(Continued)

(58) Field of Classification Search
CPC ....... H01L 29/78642; H01L 21/823418; H01L 29/0847; H01L 29/42392; H01L 29/66666; H01L 29/66795; H01L 29/785
(Continued)

(56) References Cited

U.S. PATENT DOCUMENTS 6,268,621 B1    7/2001  Emmi et al.
9,136,363 B2    9/2015  Park et al.
(Continued)

FOREIGN PATENT DOCUMENTS

CN    104576733 A    4/2015
CN    105493252 A    4/2016
(Continued)

OTHER PUBLICATIONS

China National Intellectual Property Administration, Search Report and Written Opinion, counterpart PCT application PCT/IB2021/054687, dated Sep. 9, 2021, pp. 1-11.

*Primary Examiner* — Mohammad M Hoque
(74) *Attorney, Agent, or Firm* — James Olsen; Otterstedt & Kammer PLLC

(57) ABSTRACT

Epitaxially grow first lower source-drain regions within a substrate. Portions of the substrate adjacent the lower regions are doped to form second lower source-drain regions. An undoped silicon layer is formed over the first and second lower regions. Etch completely through the undoped layer into the first and second lower regions to form fins and to define bottom junctions beneath the fins. The fins and bottom junctions define intermediate cavities. Form lower spacers, gates, and upper spacers in the cavities; form top junctions on outer surfaces of the fins; and form epitaxially grown first upper source-drain regions outward of the upper spacers and opposite the first lower regions. The first upper regions are doped the same as the first lower regions. Form second upper source-drain regions outward of the upper spacers and opposite the second lower regions; these are doped the same as the second lower regions.

13 Claims, 9 Drawing Sheets

(51) Int. Cl.
 *H01L 29/423* (2006.01)
 *H01L 29/66* (2006.01)
 *H01L 21/8234* (2006.01)
 *H01L 29/08* (2006.01)

(52) U.S. Cl.
 CPC .. *H01L 29/42392* (2013.01); *H01L 29/66666* (2013.01); *H01L 29/66795* (2013.01); *H01L 29/785* (2013.01)

(58) Field of Classification Search
 USPC ........................................................ 257/329
 See application file for complete search history.

(56) References Cited

U.S. PATENT DOCUMENTS

| | | |
|---|---|---|
| 9,761,728 B1 | 9/2017 | Cheng et al. |
| 9,831,317 B1* | 11/2017 | Zang ..................... H01L 27/092 |
| 9,865,730 B1* | 1/2018 | Jagannathan ....... H01L 29/0847 |
| 10,141,448 B1 | 11/2018 | Miao et al. |
| 10,157,798 B1* | 12/2018 | Chi ................. H01L 21/823487 |
| 10,170,473 B1* | 1/2019 | Zang .................... H01L 29/1037 |
| 10,453,844 B2 | 10/2019 | Ok et al. |
| 10,529,716 B1 | 1/2020 | Lee et al. |
| 2017/0373159 A1* | 12/2017 | Cheng ................... H01L 21/845 |
| 2018/0254344 A1* | 9/2018 | Cheng ............... H01L 29/78642 |
| 2019/0312129 A1 | 10/2019 | Zhang et al. |

FOREIGN PATENT DOCUMENTS

| | | |
|---|---|---|
| CN | 109863578 A | 6/2019 |
| CN | 209045570 | 6/2019 |

\* cited by examiner

PRECISE BOTTOM JUNCTION FORMATION FOR VERTICAL TRANSPORT FIELD EFFECT TRANSISTOR WITH HIGHLY DOPED EPITAXIAL SOURCE/DRAIN, SHARP JUNCTION GRADIENT, AND/OR REDUCED PARASITIC CAPACITANCE

BACKGROUND

The present invention relates to the electrical and electronic arts, and more specifically, to semiconductor fabrication techniques and the like.

For fin field-effect transistor (FINFET) technology, junction formation and proximity are primarily controlled by extension implantation and lateral ball reactive ion etching (RIE) (cavity formation). For a vertical transport field effect transistor (VTFET), these options are not readily available for bottom junction formation. This poses a pertinent device challenge for VTFET fabrication; namely, how to precisely control proximity of the bottom junction to the channel while maintaining process window and bottom spacer reliability. Current techniques for VTFET bottom junction formation also typically result in a capacitance penalty.

Co-assigned U.S. Pat. No. 9,761,728 discloses a self-aligned source/drain junction for a vertical field-effect transistor (FET) and a method of forming the same. Aspects include a bottom epitaxial formation concept. Although a substantial advance in the state of the art, the junction region is defined by dopant diffusion from the bottom spacer, with potential impact on proximity control and complementary metal oxide semiconductor (CMOS) compatibility.

FIG. 1 shows aspects of a prior art fin formation process as disclosed in the aforementioned U.S. Pat. No. 9,761,728. Note substrate 103, doped layer 105, fins 120, and hardmask 125. Fins 120 are formed in an undoped semiconductor layer, and the fin etching stops within the undoped semiconductor layer so that a portion 123 of this layer remains on layer 105 at the base of the fins 120.

BRIEF SUMMARY

Embodiments of the present disclosure provide techniques for precise bottom junction formation for a vertical transport field effect transistor with a highly doped epitaxial source/drain, sharp junction gradient, and/or reduced parasitic capacitance.

According to an embodiment of the present invention, an exemplary method includes epitaxially growing a plurality of first lower source-drain regions within a substrate. The first lower source-drain regions are doped with one of an n-type dopant and a p-type dopant, and portions of the substrate laterally adjacent the epitaxially grown lower source-drain regions are doped with an opposite one of the n-type dopant and the p-type dopant to form second lower source-drain regions. Further steps include forming an undoped silicon layer over the substrate with the first and second lower source-drain regions; and etching the undoped silicon layer to form fins with outer surfaces. The etching extends completely through the undoped silicon layer into the first and second lower source-drain regions, and the etching defines bottom junctions beneath the fins. The fins and bottom junctions define intermediate cavities. Still further steps include forming lower spacers, gates, and upper spacers in the cavities; forming top junctions on the outer surfaces of the fins; and forming doped epitaxially grown first upper source-drain regions outward of the upper spacers and opposite the doped epitaxially grown first lower source-drain regions. The doped epitaxially grown upper source-drain regions are doped with the one of an n-type dopant and a p-type dopant. Yet a further step includes forming second upper source-drain regions outward of the upper spacers and opposite the second lower source-drain regions. The second upper source-drain regions are doped with the opposite one of the n-type dopant and the p-type dopant.

According to another embodiment of the present invention, an exemplary structure includes a substrate having a plurality of first lower source-drain regions and a plurality of second lower source-drain regions. The first lower source-drain regions are doped with one of an n-type dopant and a p-type dopant, the second lower source drain regions being doped with an opposite one of the n-type dopant and the p-type dopant, and the first and second lower source drain regions have coplanar outer surfaces. Also included are a first plurality of bottom junctions extending from the outer surfaces of the first lower source-drain regions; a second plurality of bottom junctions extending from the outer surfaces of the second lower source-drain regions; and a first plurality of fins located on the first plurality of bottom junctions. The first plurality of fins have outer ends. A second plurality of fins are located on the second plurality of bottom junctions, and cooperatively with the first plurality of fins, define intermediate cavities. The second plurality of fins have outer ends, and the intermediate cavities extend into the first and second lower source-drain regions. A plurality of spacer-gate structures are located in the cavities. A first plurality of top junctions are located on the outer ends of the first plurality of fins and a second plurality of top junctions are located on the outer ends of the second plurality of fins. A plurality of first upper source-drain regions are located outwardly of the spacer-gate structures in contact with the first plurality of top junctions, and are doped with the one of an n-type dopant and a p-type dopant; and a plurality of second upper source-drain regions are located outwardly of the spacer-gate structures in contact with the second plurality of top junctions, and are doped with the opposite one of the n-type dopant and the p-type dopant.

According to a further embodiment of the present invention, a further exemplary method includes encoding, into a design structure embodied on a non-transitory computer-readable medium, a design for an integrated circuit. The design structure specifies a design such as is set forth in the preceding paragraph; the spacer-gate structures include lower spacers of dielectric material having a depth $t_s$, and the bottom junctions extend outward from the first and second lower source-drain regions by a distance RIE, such that a lower junction-channel proximity x is given by $x=t_s-RIE$. The spacer-gate structures of the specified design further including gates outward of the lower spacers and upper spacers outward of the gates. The lower junction-channel proximity is defined between outer surfaces of the bottom junctions and inner edges of the gates. A further step includes cooperatively specifying, within the design structure, the spacer thickness $t_s$ and the distance RIE, such that lower junction-channel proximity results in adequate performance with parasitic capacitance less than a predetermined value and dielectric breakdown greater than a predetermined value.

Techniques of the present invention can provide substantial beneficial technical effects. For example, one or more embodiments provide:

pre-grown source/drain (S/D) epitaxial formation before fin RIE, with precise control of the transition between the highly doped epitaxial region and the undoped silicon;

enabling of close proximity of the junction to the channel for high performance, based on precise control of the fin RIE depth into the S/D epitaxial layer and on the spacer deposition thickness, enhancing reliability and/or reducing parasitic capacitance;

decoupling of the need for epitaxial region proximity from the bottom spacer thickness to minimize parasitic capacitance; and/or decoupling of the need for epitaxial region proximity from the bottom spacer thickness to enhance bottom junction spacer reliability.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

One or more embodiments provide precise bottom junction formation for VTFETs, with highly doped S/D epitaxial regions, sharp junction gradients, and/or reduced parasitic capacitance. Current VTFET fabrication techniques, as noted, pose challenges with regard to how to precisely control bottom junction proximity to the channel, while maintaining process window and bottom spacer reliability. One or more embodiments carry out pre-grown S/D epitaxial formation before fin RIE, with precise control of the transition between the highly doped epitaxial region and the undoped silicon.

One or more embodiments enable close proximity of the junction to the channel for high performance, based on precise control of the fin RIE depth into the S/D epitaxial layer and on the spacer deposition thickness, enhancing reliability and/or reducing parasitic capacitance.

One or more instances decouple the need for epitaxial region proximity from the bottom spacer thickness to minimize parasitic capacitance and/or to enhance bottom junction spacer reliability.

Figure 2B:
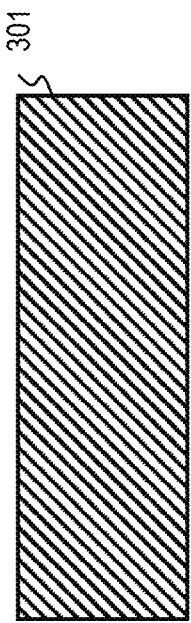
FIG. 2A and FIG. 2B are top and side views, respectively, of a semiconductor substrate which provides a starting point for a fabrication process in accordance with aspects of the invention.
Figure 3B:
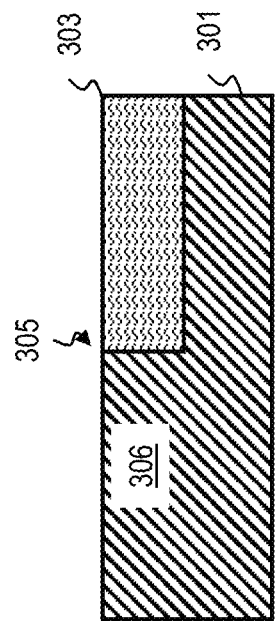
FIG. 3A and FIG. 3B are top and side views, respectively, of a structure which results after epitaxial source/drain region formation on the substrate of FIG. 2A and FIG. 2B, in accordance with aspects of the invention.
Figure 2A:
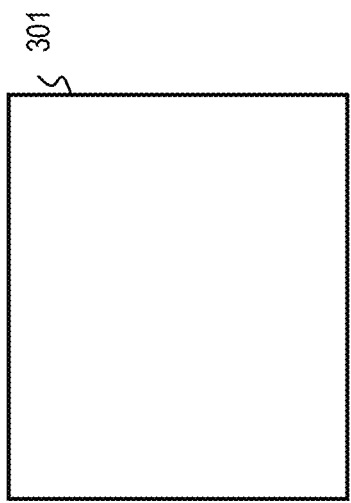
Figure 3A:
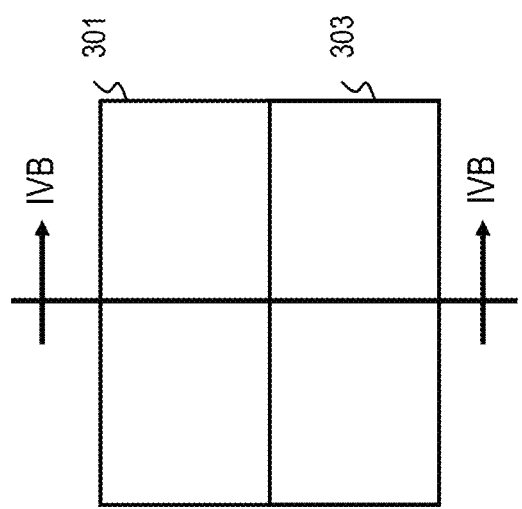

FIG. 2A and FIG. 2B are top and side views, respectively, of a semiconductor substrate 301, which provides a starting point for a fabrication process in accordance with aspects of the invention. The substrate can be, for example, bulk silicon, silicon on insulator (SOI), or other suitable material. FIG. 3A and FIG. 3B are top and side views, respectively, of the substrate 301 of FIG. 2A and FIG. 2B, after forming a patterned bottom S/D epitaxial region 303, with a high doping level for resistance reduction, in accordance with aspects of the invention (a "high" doping level includes, e.g. 1E19-1E21 carriers per cubic centimeter of known n-type or p-type dopants, as the case may be; e.g., boron, phosphorous, arsenic, and the like, as known to the skilled artisan). FIG. 3B is a view along line IVB-IVB in FIG. 3A. Region 303 can be formed, for example, by removing a corresponding region of substrate 301 via known lithography and etching processes, to form a cavity, followed by epitaxial growth of the region 303 in the cavity. To facilitate the epitaxial growth, the surface of the cavity should be flat and of high-quality; i.e., defect free. The skilled artisan is familiar with conditions appropriate for achieving epitaxial growth. Regions 303 form first lower source-drain regions while adjacent regions 306 form second lower source-drain regions.

Figure 4B:
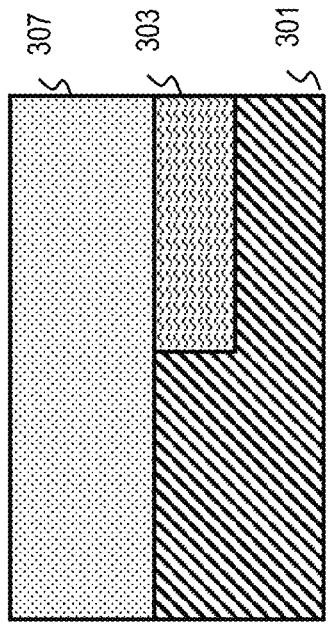
FIG. 4A and FIG. 4B are top and side views, respectively, of the structure of FIG. 3A and FIG. 3B, after formation of an undoped silicon layer, in accordance with aspects of the invention.
Figure 4C:
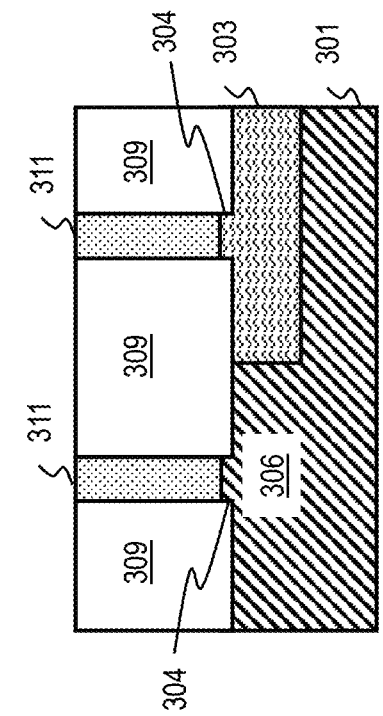
FIG. 4C is a side view of the structure of FIG. 4A and FIG. 4B, after fin RIE, in accordance with aspects of the invention.
Figure 4A:
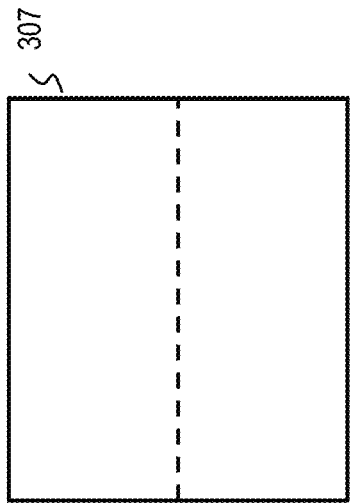

FIG. 4A and FIG. 4B are top and side views, respectively, of the structure of FIG. 3A and FIG. 3B, after formation of an undoped silicon layer 307, in accordance with aspects of the invention. Layer 307 can be formed using known deposition techniques. The dotted line in FIG. 4A represents the transition between materials 301 and 303. FIG. 4C is a side view of the structure of FIG. 4A and FIG. 4B, after fin RIE, in accordance with aspects of the invention. The RIE removes the undoped silicon 307, and a small amount of the substrate 301 and epitaxial material 303, in gap regions 309, while leaving fins 311. For example, a hard mask made of known material(s) can be formed on top of the regions where fins 311 are to be formed, using known techniques, such as (but not limited to) spacer patterning using mandrels to achieve linewidths smaller than can be achieved by conventional lithography. Exemplary values of the RIE depth into the SD epitaxial layer 303 are provided elsewhere herein.

The portions of the substrate 301 and epitaxial material 303 that extend outwardly of the surface of the substrate-epitaxial material after RIE are the bottom junctions 304.

We have found that, for formation of a p-type field effect transistor (PFET), close proximity of the junction to the channel (see discussion of FIG. 7 below), with a sharp gradient, is quite pertinent to designing for device performance. In one or more embodiments, a sharp junction is achieved between the substrate 301 and the highly doped S/D epitaxial region 303; i.e., there is a high gradient in the dopant concentration due to use of epitaxial growth instead of thermal diffusion from a bottom spacer.

Figure 5A:
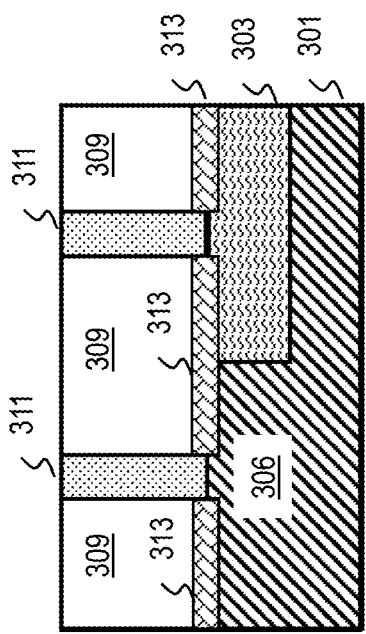
FIG. 5A is a side view of the structure of FIG. 4C, after bottom spacer formation, in accordance with aspects of the invention.

FIG. 5A is a side view of the structure of FIG. 4C, after formation of bottom spacers 313, in accordance with aspects of the invention. Exemplary values of the spacer thickness are provided elsewhere herein. Bottom spacers 313 can be formed of known materials (e.g. suitable low-K materials/dielectric oxides) using known techniques, such as, for example plasma enhanced chemical vapor deposition (PECVD)-type, high aspect ratio process (HARP)-type or high density plasma (HDP)-type low-K dielectric layers, including, but not limited to, silicon boron nitride (SiBN), siliconborocarbonitride (SiBCN), silicon oxycarbonitride (SiOCN), SiN or $SiO_2$, or the like. The same are deposited on the bottoms of cavities 309 using, for example, a directional deposition technique, including, but not necessarily limited to, a gas cluster ion beam (GCIB) or other directional process. Any spacer material that forms on the sidewalls and/or outward ends of fins 311 can be removed using known techniques. Exemplary values of the proximity x of the epitaxial material 303 to the channel are provided elsewhere herein (see FIG. 7: x=difference between spacer thickness is and dimension RIE—dimension RIE is the height of the junction and also the depth of the etching into regions 303, 306). Advantageously, this approach provides flexibility to optimize the device and results in reduced parasitic capacitance. As will be appreciated by the skilled artisan, the capacitance, C, of a parallel plate capacitor is given by $C=\varepsilon A/d$, where c is the permittivity of the dielectric, A is the area, and d is the distance between the plates. With constant area and permittivity, increasing d (spacer thickness) will lower the capacitance C. Increasing the thickness also reduces the chances of dielectric breakdown.

Figure 5B:
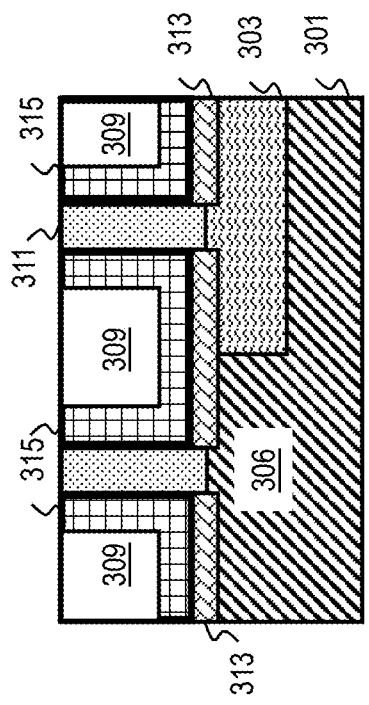
FIG. 5B is a side view of the structure of FIG. 5A, after gate formation, in accordance with aspects of the invention.

FIG. 5B is a side view of the structure of FIG. 5A, after formation of gate structures 315, in accordance with aspects of the invention. The metal gate for NMOS transistors typically requires a work function close to the conduction band of Si (~4.1 eV) and the PMOS transistor typically needs a metal gate with a work function close to the Si valence band (~5 eV). There are known metals with the right work functions, e.g., TiN for PMOS devices and Al for NMOS devices. The gate stack can be formed, for example, via gate metal patterning steps for the p- and n-regions, followed by gate metal recess. Given the teachings herein, the skilled artisan can select appropriate gate materials and gate fabrication processes.

Figure 6:
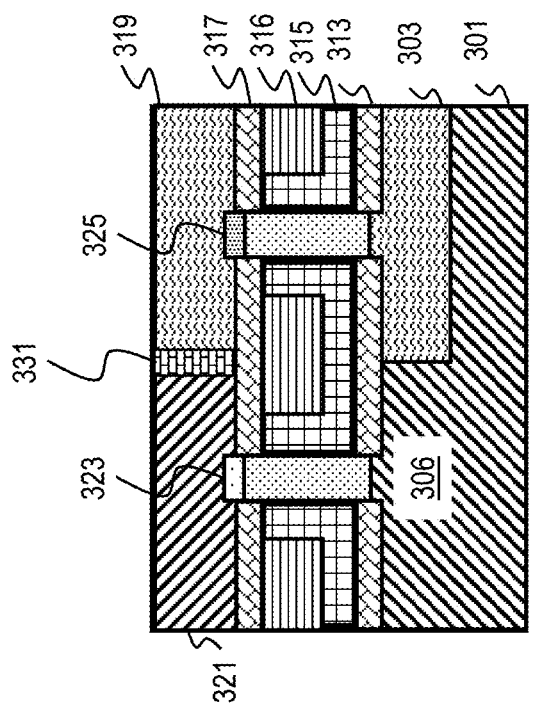
FIG. 6 is a side view of the structure of FIG. 5B, after top junction formation and middle of line (MOL) and back end of line (BEOL) processing, in accordance with aspects of the invention, wherein a spacer thickness is greater than a depth of etching.

FIG. 6 is a side view of the structure of FIG. 5B, after top junction formation and middle of line (MOL) and back end of line (BEOL) processing, in accordance with aspects of the invention. Note upper spacers 317, top junctions 323, 325, upper S/D epitaxial region 319, and epitaxially grown material 321. Upper spacers 317 can be formed using similar materials and processes as for lower spacers 313. The gate metal in FIG. 6 is recessed as compared to FIG. 5B and does not extend to the tops of the fins. The gate metal can be recessed prior to formation of the top spacer 317. Top junctions 323, 325 can be formed by ion implantation using suitable dopants known to the skilled artisan; e.g., boron or $BF_2$ for p-type and phosphorous or arsenic for n-type. Upper epitaxial S/D region 319 is grown epitaxially over junction 325. In one or more embodiments, where regions 303, 319 are n-type, region 321 is p-type as is the underlying portion of 301; conversely, where regions 303, 319 are p-type, region 321 is n-type as is the underlying portion of 301. See discussion of FIG. 8 below. Note that there will typically be a dielectric spacer 331 separating the n-FET and p-FET regions on the top. Such a spacer is typically not needed between materials 301, 303 on the bottom (although may be appropriate in some instances as discussed elsewhere herein). The dielectric spacer 331 helps to avoid growing p-type material on the n-side and vice-versa. Similar materials can be used as for spacers 313, 317. Material 316 is an optional inter-layer dielectric (ILD), e.g. oxide, nitride, or the like; in other embodiments the regions 316 are just part of the gate metal 315. Please note that bottom junction formation as disclosed herein can be employed for many different types of VTFET architectures besides that depicted herein.

As will be appreciated by the skilled artisan, vertical transport architecture FET devices include first source/drain regions 303, 319 at ends of the fins 311 on top and bottom sides of the fins so that current runs through the fins in a vertical direction (e.g., perpendicular to substrate 301) from a bottom source/drain region 303 to a top source/drain region 319. When the appropriate voltage is applied to the gate structures 315, the fins 311 become conductive channels.

Figure 1:
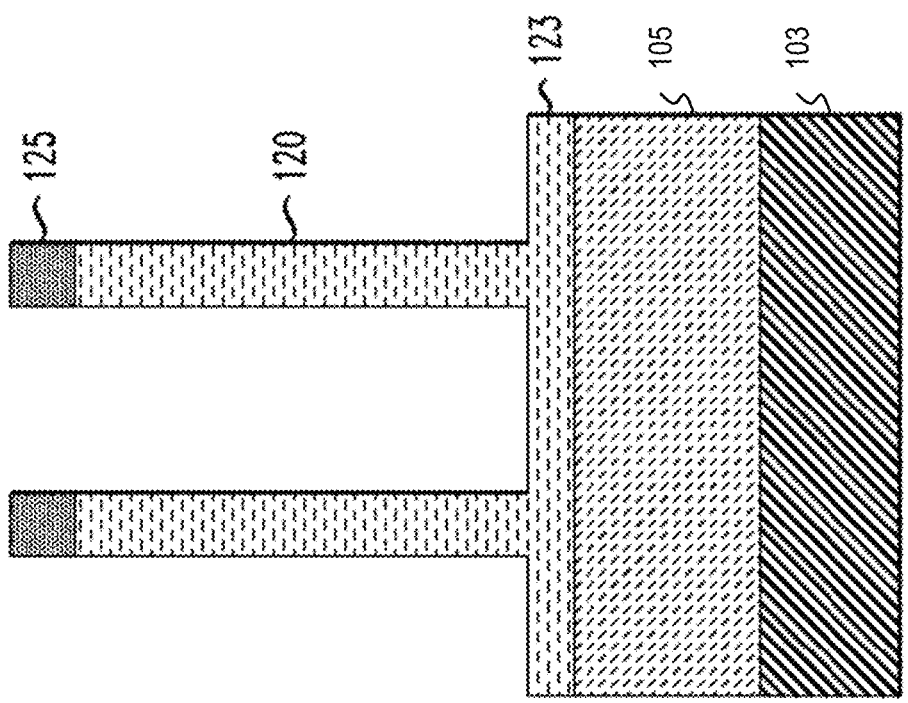
FIG. 1 shows aspects of a prior art fin formation process.

It is instructive to compare the structure of FIG. 4C with that of FIG. 1. As noted, in FIG. 1, fins 120 are formed in an undoped semiconductor layer, and the fin etching (RIE) stops within the undoped semiconductor channel layer so that a portion 123 of this layer remains on layer 105 at the base of the fins 120. In FIG. 4C, however, regions 309 are etched all the way through layer 307 into regions 301 and 305, such that fins 311 rest on small portions of material 301, 309 as the case may be. Thus, in one or more embodiments, as seen in FIG. 4C, in a pFET region, the fin RIE (which forms regions 309 defining fins 311) extends into the highly doped epitaxial layer 303 (and into regions 306) to form the proper junction overlap.

In the prior art, self-aligned S/D junction dopant is defined by the dopant class technique (BSG (Borosilicate glass)/PSG (Phosphosilicate glass)/etc.). The junction is self-aligned; however, there is lack of capability for junction proximity, and dopant concentration tuning, which are often needed for performance optimization and/or manufacturability. In one or more embodiments, the self-aligned S/D is defined by the pre-grown epitaxial layer 303. The location is defined by the relative fin recess into the epitaxial layer. Refer to FIG. 4C. Exemplary values of the RIE depth into the SD epitaxial layer are provided elsewhere herein. One or more embodiments advantageously address junction proximity tuning capability and/or junction dopant tuning capability.

Thus, one or more embodiments advantageously provide a structure for pre-grown S/D epitaxial formation (region 303 in FIG. 4B) before FIN RIE (FIG. 5C), with precise control of the transition between the highly doped epitaxial region 303 and the undoped Si region 301. One or more embodiments include a structure to enable close proximity of the junction to the channel for high performance, based on precise control of the fin RIE depth into the S/D epitaxial layer and on the spacer deposition thickness, enhancing reliability and/or reducing parasitic capacitance. As noted elsewhere, one or more instances decouple the need for epitaxial region proximity from the bottom spacer thickness to minimize parasitic capacitance and/or to enhance bottom junction spacer reliability.

Figure 7:
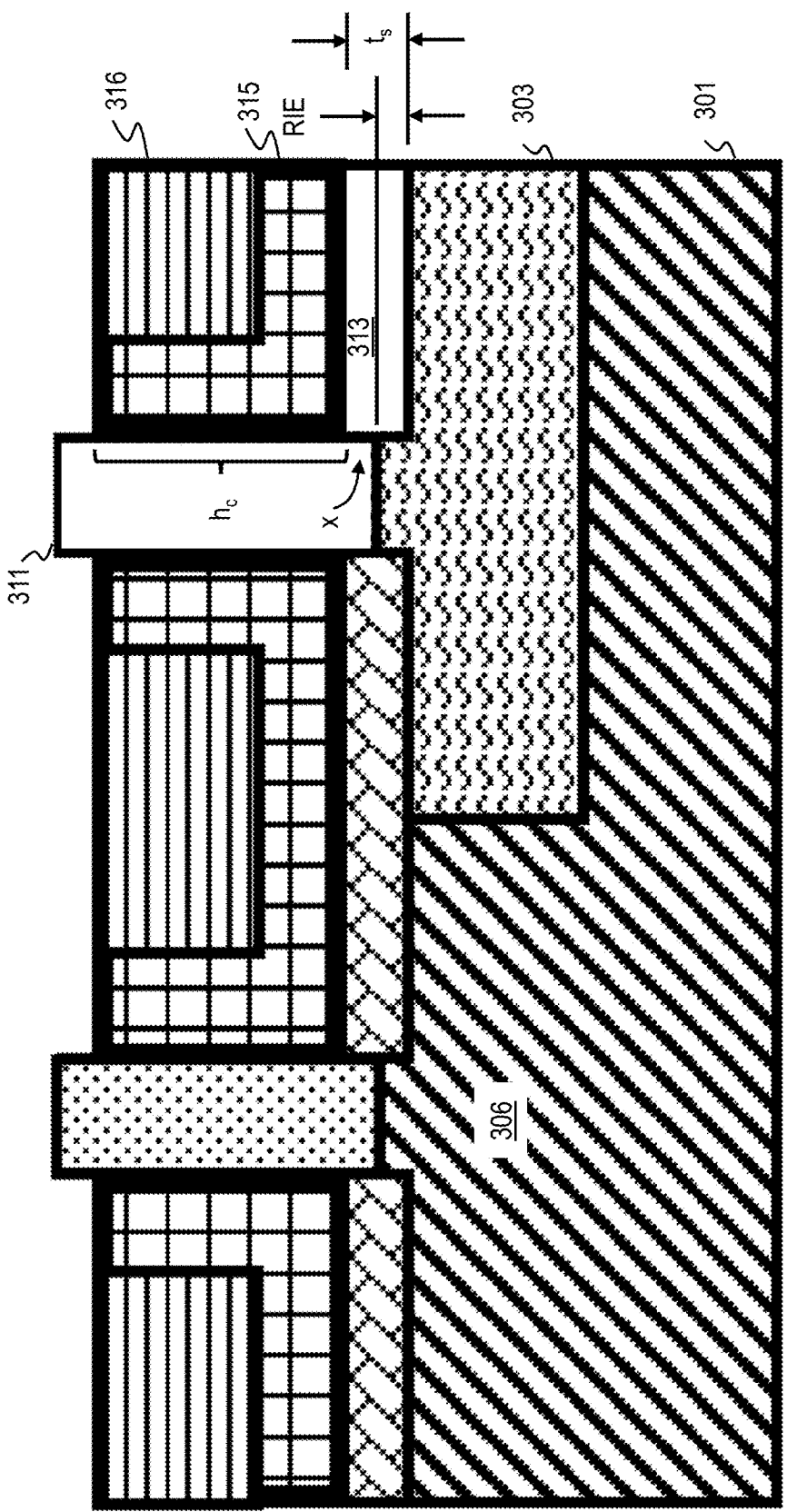
FIG. 7 is an enlarged view of FIG. 6 with certain pertinent dimensions labeled.

Referring now to FIG. 7, one or more embodiments predefine highly doped epitaxial region 303. Etching through layer 307 (refer to FIGS. 4B and 4C) into the epitaxial region 303 enables precise control of (i) the height of junction 304 and (ii) the thickness of bottom spacer 313. Note that cross-hatching is removed from bottom spacer 313 and fin 311 in FIG. 7 to permit an unobstructed view of the dimensions. In particular, dimension RIE is the depth of the RIE into the epitaxial region, which is also the height of junction 304. On top of junction 304 is the channel having height $h_c$; below is the S/D region 303. The channel forms in fin 311 only opposite gate 315. Increased thickness of the bottom spacer is advantageous to reduce the parasitic capacitance. Bottom spacer thickness is designated as $t_s$. However, the junction typically should be sufficiently close to the channel to avoid a negative impact on device performance. The device can be optimized by recessing an appropriate amount into the epitaxial material (dimension RIE) while at the same time increasing the spacer thickness $t_s$, thereby reducing parasitic capacitance without compromising performance, because proximity from the junction to the channel is still maintained. Such proximity is designated in FIG. 7 as x and is the difference between the spacer thickness $t_s$ and the RIE depth (dimension RIE). Spacer reliability is very challenging in leading-edge technology nodes—dielectric breakdown from the contact to the gate through the spacer can be a problem. Advantageously, in one or more embodiments, the ability to increase the spacer thickness $t_s$ without impacting device performance also mitigates these reliability concerns.

It will thus be appreciated that one or more embodiments reduce parasitic capacitance and/or potential for dielectric breakdown by increasing $t_s$, but without a performance penalty that might be encountered in prior art devices, because the etching into the epitaxial material (dimension RIE) allows the desired junction-channel proximity to be maintained regardless of the spacer thickness.

Figure 8:
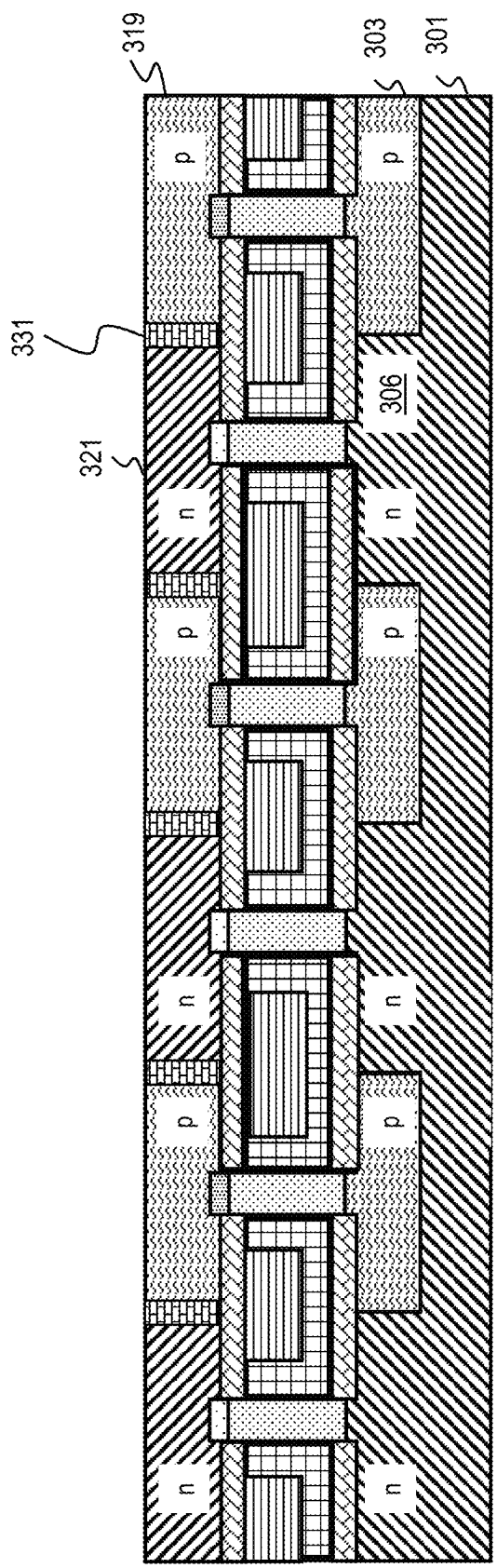
FIG. 8 shows a larger CMOS structure with a plurality of repeating structures similar to that of FIG. 6.

FIG. 8 shows a larger CMOS structure with a plurality of repeating structures similar to that of FIG. 6. The regions 303, 319 are p-type and the regions 306, 321 are n-type. In other embodiments, the epitaxially grown regions 303 and corresponding regions 319 could be n-type and regions 306, 321 could be p-type.

There are numerous techniques used by those skilled in the art to remove material at various stages of creating a semiconductor structure. As used herein, these processes are referred to generically as "etching." For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method is novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary method, according to an aspect of the invention, includes the step of epitaxially growing a plurality of first lower source-drain regions 303 within a substrate 301. The first lower source-drain regions are doped with one of an n-type dopant and a p-type dopant, and portions of the substrate laterally adjacent the epitaxially grown lower source-drain regions are doped with an opposite one of the n-type dopant and the p-type dopant to form second lower source-drain regions 306. One non-limiting manner to carry out such a step includes epitaxially growing a plurality of first lower source-drain regions 303 within a substrate 301; doping the epitaxially grown first lower source-drain regions 303 with one of an n-type dopant and a p-type dopant; and doping portions 306 of the substrate 301 that are laterally adjacent to the epitaxially grown lower source-drain regions 303 with an opposite one of the n-type dopant and the p-type dopant to form second lower source-drain regions. A variety of techniques can be used to carry out such a step. For example, separate epitaxially grown regions can be employed; for example, first n-type, then p-type, optionally with an isolation structure similar to 331. In another approach, carry out blanket implantation of n-type dopant, highly dope the entire substrate 301, and then etch trenches for growing the p-type epitaxially grown material 303 and grow same. In still another approach, epitaxially grow n-type material over the entire substrate 301, then etch the trenches for the p-type material, epitaxially grow same, planarize, and grow the silicon 307—isolation like 331 is typically not needed in this approach. It will thus be appreciated that doping of various regions can be carried out in a number of different manners and in different orders.

Additional steps include forming (e.g. via deposition or epitaxial growth) an undoped silicon layer 307 over the substrate 301 with the first and second lower source-drain regions 303, 306; and etching the undoped silicon layer 307 to form fins 311 with outer surfaces. The etching extends completely through the undoped silicon layer into the first and second lower source-drain regions 303, 306. The etching defines bottom junctions 304 beneath the fins, and the fins and bottom junctions define intermediate cavities 309. Further steps include forming lower spacers 313, gates 315, and upper spacers 317 in the cavities; forming top junctions 323, 325 on the outer surfaces of the fins 311; and forming doped epitaxially grown first upper source-drain regions 319 outward of the upper spacers 325 and opposite the doped epitaxially grown first lower source-drain regions 303. The doped epitaxially grown upper source-drain regions 319 are doped with the one of an n-type dopant and a p-type dopant (i.e. same as regions 303). A still further step includes forming second upper source-drain regions 321 outward of the upper spacers 323 and opposite the second lower source-drain regions 306. The second upper source-drain regions 321 are doped with the opposite one of the n-type dopant and the p-type dopant (i.e. same as regions 306).

In one or more embodiments, forming top junctions on the outer surfaces of the fins includes forming a first plurality of the top junctions 325 outward of the first lower source-drain regions 303 and a second plurality of the top junctions 323 outward of the second lower source-drain regions 306. Further, forming the doped epitaxially grown first upper source-drain regions includes forming the doped epitaxially grown first upper source-drain regions 319 in contact with the first plurality of the top junctions 325, and forming the second upper source-drain regions 321 includes forming the second upper source-drain regions in contact with the second plurality of the top junctions 323.

In some embodiments, the etching includes reactive ion etching and extends into the first and second lower source-drain regions by a dimension RIE, and forming the lower spacers 313 includes depositing dielectric material to a depth $t_s$, such that a lower junction-channel proximity x is given by $x=t_s-RIE$.

In depositing the dielectric material to the depth $t_s$, the depth $t_s$ ranges in some instances from about 5 nm to about 20 nm; in some instances from about 5 nm to about 15 nm; in some instances from about 5 nm to about 12 nm; in some instances from about 7 nm to about 20 nm; in some instances from about 7 nm to about 15 nm; in some instances from about 7 nm to about 12 nm; and in some instances from about 9 nm to about 12 nm.

Figure 12:
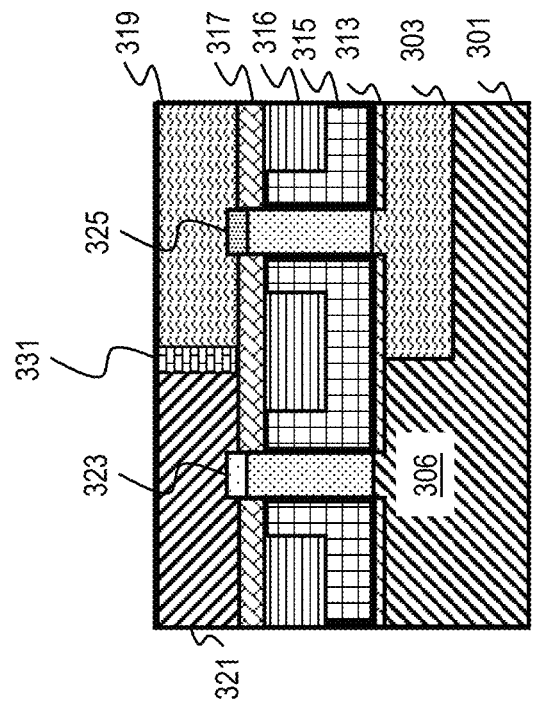
FIG. 12 is a view similar to FIG. 6, wherein a spacer thickness is less than a depth of etching.
Figure 11:
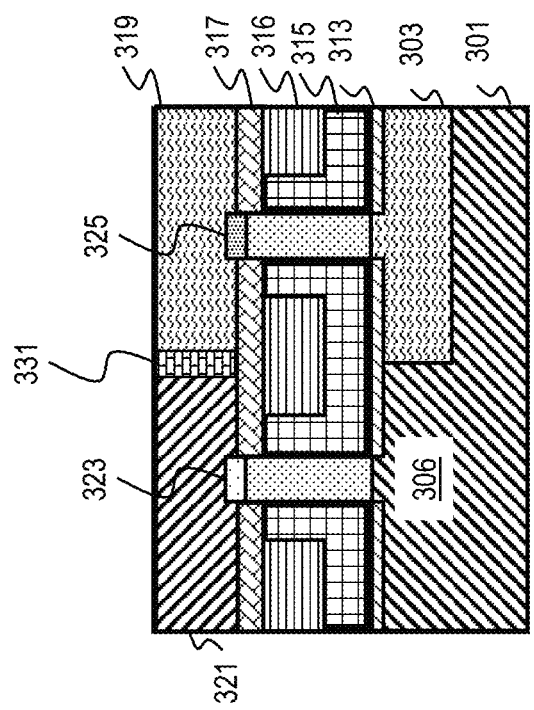
FIG. 11 is a view similar to FIG. 6, wherein a spacer thickness is equal to a depth of etching.

In one or more embodiments, the spacer thickness $t_s$ is defined/selected first based on device implications. Next, select the value of the lower junction-channel proximity x, which can range from about minus 3 to about plus 10 nm; or from about 0 to about 9 nm; or from about 1 to about 9 nm; or can be about 3 nm. This then implies the RIE depth from the formula $x=t_s-RIE$. In the etching step, the dimension RIE ranges in some cases from about 6 nm to about 10 nm, with values of $t_s$ and x selected to satisfy the formula. FIGS. 6 and 7 show the spacer thickness $t_s$>RIE. FIG. 11 shows the spacer thickness $t_s$=RIE. FIG. 12 shows the spacer thickness $t_s$<RIE.

Referring to FIG. 8, in one or more embodiments, the one of an n-type dopant and a p-type dopant is the p-type dopant; and the opposite one of the n-type dopant and the p-type dopant is the n-type dopant.

In another aspect, an exemplary structure includes a substrate 301 having a plurality of first lower source-drain regions 303 and a plurality of second lower source-drain regions 306. The first lower source-drain regions are doped with one of an n-type dopant and a p-type dopant, and the second lower source drain regions are doped with an opposite one of the n-type dopant and the p-type dopant. The first and second lower source drain regions have coplanar outer surfaces. A first plurality of bottom junctions 304 extend from the outer surfaces of the first lower source-drain regions 303; and a second plurality of bottom junctions 304 extend from the outer surface of the second lower source-drain regions 306. A first plurality of fins 311 are located on the first plurality of bottom junctions, and the first plurality of fins have outer ends; a second plurality of fins 311 are located on the second plurality of bottom junctions and cooperatively with the first plurality of fins define intermediate cavities. The second plurality of fins have outer ends, and the intermediate cavities extend into the first and second lower source-drain regions 303, 306.

A plurality of spacer-gate structures (e.g. 313, 315, 317 and optionally 316) are located in the cavities. A first plurality of top junctions 325 are located on the outer ends of the first plurality of fins; and a second plurality of top junctions 323 are located on the outer ends of the second plurality of fins. A plurality of first upper source-drain regions 319 are located outwardly of the spacer-gate structures in contact with the first plurality of top junctions, and the first upper source-drain regions are doped with the one of an n-type dopant and a p-type dopant (i.e. same type of dopant as regions 303). A plurality of second upper source-drain regions 321 are located outwardly of the spacer-gate structures in contact with the second plurality of top junctions, and the second upper source-drain regions are doped with the opposite one of the n-type dopant and the p-type dopant (i.e. same type of dopant as regions 306).

In one or more embodiments, the spacer-gate structures include lower spacers of dielectric material having a depth $t_s$, and the bottom junctions extend outward from the first and second lower source-drain regions by a distance RIE, such that a lower junction-channel proximity x is given by $x=t_s-RIE$.

In some instances, the spacer-gate structures further include gates 315 outward of the lower spacers 313 and upper spacers 317 outward of the gates. The lower junction-channel proximity is defined between outer surfaces of the bottom junctions and inner edges of the gates.

In one or more embodiments, regions 303 are epitaxially grown such that the substrate 301 and the plurality of first lower source-drain regions 303 have the same crystal orientation.

In some cases, the first lower source-drain regions have a dopant concentration of from about 1E19 to about 1E21 carriers per cubic centimeter.

As shown in FIG. 8, in one or more embodiments, the one of an n-type dopant and a p-type dopant is the p-type dopant; and the opposite one of the n-type dopant and the p-type dopant is the n-type dopant.

In another aspect, an exemplary method includes encoding, into a design structure embodied on a non-transitory computer-readable medium, a design for an integrated circuit. See discussion of design structures and FIG. 10. The design structure specifies a design as set forth herein. For example, the design structure includes a substrate 301 having a plurality of first lower source-drain regions 303 and a plurality of second lower source-drain regions 306. The first lower source-drain regions are doped with one of an n-type dopant and a p-type dopant, and the second lower source drain regions are doped with an opposite one of the n-type dopant and the p-type dopant. The first and second lower source drain regions have coplanar outer surfaces; a first plurality of bottom junctions 304 extend from the outer surfaces of the first lower source-drain regions; a second plurality of bottom junctions 304 extend from the outer surfaces of the second lower source-drain regions; a first plurality of fins 311 are located on the first plurality of bottom junctions, and the first plurality of fins have outer ends. A second plurality of fins 311 are located on the second plurality of bottom junctions, and cooperatively with the first plurality of fins, define intermediate cavities 309. The second plurality of fins have outer ends, and the intermediate cavities extend into the first and second lower source-drain regions (see FIG. 4C). A plurality of spacer-gate structures are located in the cavities, the spacer-gate structures include lower spacers 313 of dielectric material having a depth $t_s$, and the bottom junctions extend outward from the first and second lower source-drain regions by a distance RIE, such that a lower junction-channel proximity x is given by $x = t_s - RIE$. The spacer-gate structures further include gates 315 outward of the lower spacers and upper spacers 317 outward of the gates. The lower junction-channel proximity is defined between outer surfaces of the bottom junctions and inner edges of the gates. A first plurality of top junctions 325 are located on the outer ends of the first plurality of fins; and a second plurality of top junctions 323 are located on the outer ends of the second plurality of fins. A plurality of first upper source-drain regions 319 are located outwardly of the spacer-gate structures in contact with the first plurality of top junctions, and the first upper source-drain regions are doped with the one of an n-type dopant and a p-type dopant. A plurality of second upper source-drain regions 321 are located outwardly of the spacer-gate structures in contact with the second plurality of top junctions 323; the second upper source-drain regions are doped with the opposite one of the n-type dopant and the p-type dopant. A further step includes cooperatively specifying, within the design structure, the spacer thickness $t_s$ and the distance RIE, such that the lower junction-channel proximity results in adequate performance with parasitic capacitance less than a predetermined value and dielectric breakdown greater than a predetermined value. For example, an electronic design automation program and/or a finite elements program can be used to check the performance, parasitic capacitance, and dielectric breakdown voltage.

The design structure can be provided to a foundry over a network (e.g. over network adapter 20 discussed below).

A further step can include fabricating an integrated circuit in accordance with the design structure.

Figure 9:
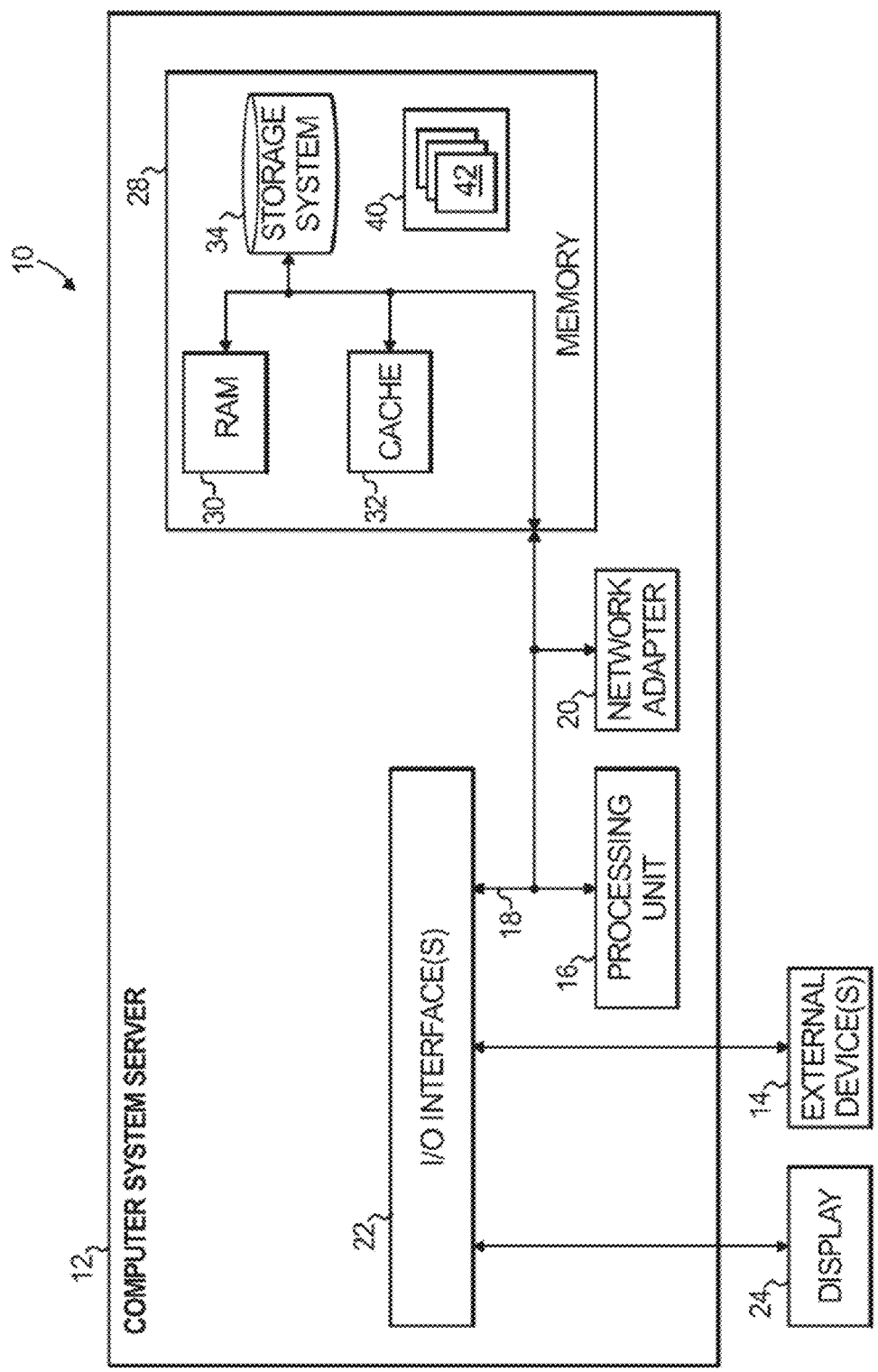
FIG. 9 depicts a computer system that may be useful in implementing one or more aspects and/or elements of the invention.

Some aspects of the invention (e.g. a design process) can be implemented in part using an apparatus including a memory and at least one processor that is coupled to the memory and operative to perform exemplary method steps (and/or control semiconductor fabrication equipment to carry out such steps). FIG. 9 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 112, and it includes both volatile and non-volatile media, removable and non-removable media.

System memory 28 can include computer system readable media in the form of volatile memory, such as random access memory (RAM) 130 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 9, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 9) running a server program. It will be understood that such a physical server may or may not include a display and keyboard.

It should be noted that any of the methods described herein can include an additional step of providing a system including distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

Some aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

Figure 10:
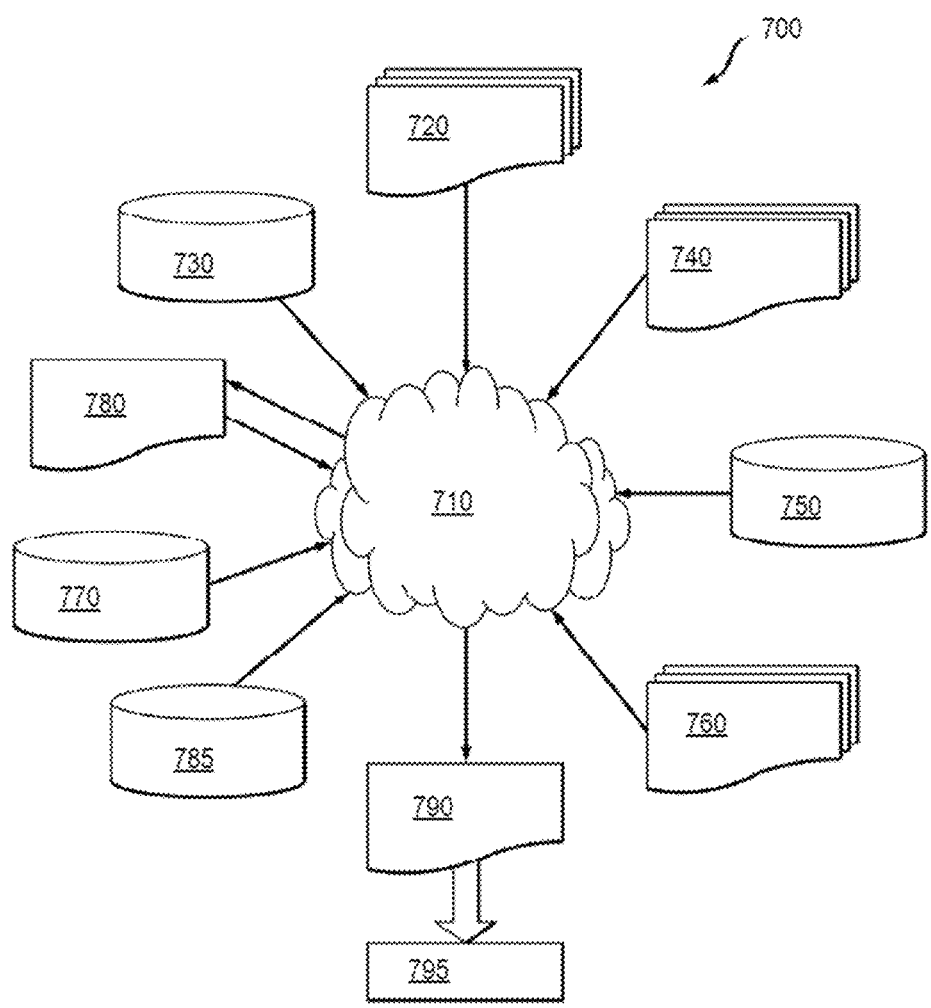
FIG. 10 is a flow diagram of a design process used in semiconductor design, manufacture, and/or test.

One or more embodiments integrate the characterizing and simulating techniques herein with semiconductor integrated circuit design simulation, test, layout, and/or manufacture. In this regard, FIG. 10 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved latch tree synthesis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc. In some instances, the following flow occurs: design house tape-out→foundry tape-out (retargeting can happen here)→mask shop→manufacturing. A design house can be a company without foundry capability; a mask shop can be a third company, different than the foundry and design house. Manufacturing is also handled at the foundry that does the retargeting, in one or more embodiments. Before the foundry tapes out, the design house may sometimes get a chance to review retargeting and react with an updated tape-out. This may be handled by smaller circuit blocks that were sent to the foundry for analysis before either tape-out. It may also happen, in some cases, if tape-out is staggered across various layers of the chip. Staggering occurs, for example, where only a few layers are taped-out while others are still being worked on and are thus subject to update if pertinent retargeting issues are known.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including interconnects and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom", and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   epitaxially growing a plurality of first lower source-drain regions within a substrate, the plurality of first lower source-drain regions being doped with one of an n-type dopant and a p-type dopant, portions of the substrate laterally adjacent the plurality of first lower source-drain regions being doped with an opposite one of the n-type dopant and the p-type dopant to form a plurality of second lower source-drain regions;
   forming an undoped silicon layer over the substrate with the plurality of first lower source-drain regions and the plurality of second lower source-drain regions;
   etching the undoped silicon layer to form fins with outer surfaces, the etching extending completely through the undoped silicon layer into the plurality of first lower source-drain regions and the plurality of second lower source-drain regions, the etching defining bottom junctions beneath the fins, the fins and the bottom junctions defining intermediate cavities;
   forming lower spacers, gates, and upper spacers in the intermediate cavities;

forming top junctions on the outer surfaces of the fins;

forming doped epitaxially grown first upper source-drain regions outward of the upper spacers and opposite the plurality of first lower source-drain regions, the doped epitaxially grown first upper source-drain regions being doped with the one of an n-type dopant and a p-type dopant; and forming second upper source-drain regions outward of the upper spacers and opposite the plurality of second lower source-drain regions, the second upper source-drain regions being doped with the opposite one of the n-type dopant and the p-type dopant.

2. The method of claim 1, wherein:

the forming of the top junctions on the outer surfaces of the fins comprises forming a first plurality of the top junctions outward of the plurality of first lower source-drain regions and a second plurality of the top junctions outward of the plurality of second lower source-drain regions;

the forming of the doped epitaxially grown first upper source-drain regions comprises forming the doped epitaxially grown first upper source-drain regions in contact with the first plurality of the top junctions; and the forming of the second upper source-drain regions comprises forming the second upper source-drain regions in contact with the second plurality of the top junctions.

3. The method of claim 2, wherein the etching comprises reactive ion etching and extends into the plurality of first lower source-drain regions and the plurality of second lower source-drain regions by a dimension RIE, and wherein forming the lower spacers comprises depositing dielectric material to a depth $t_s$, such that a lower junction-channel proximity x is given by $x=t_s-RIE$.

4. The method of claim 3, wherein, in the etching step, the dimension RIE ranges from about 6 nm to about 10 nm.

5. The method of claim 3, wherein in depositing the dielectric material to the depth $t_s$, said depth $t_s$ ranges from about 5 nm to about 20 nm.

6. The method of claim 3, wherein in depositing the dielectric material to the depth $t_s$, said depth $t_s$ ranges from about 5 nm to about 15 nm.

7. The method of claim 3, wherein in depositing the dielectric material to the depth $t_s$, said depth $t_s$ ranges from about 5 nm to about 12 nm.

8. The method of claim 3, wherein in depositing the dielectric material to the depth $t_s$, said depth $t_s$ ranges from about 9 nm to about 12 nm.

9. The method of claim 3, wherein the lower junction-channel proximity x ranges from about −3 nm to about 10 nm.

10. The method of claim 3, wherein:

the one of an n-type dopant and a p-type dopant comprises the p-type dopant; and the opposite one of the n-type dopant and the p-type dopant comprises the n-type dopant.

11. A method comprising:

encoding, into a design structure embodied on a non-transitory computer-readable medium, a design for an integrated circuit, the design structure specifying:

a substrate having a plurality of first lower source-drain regions and a plurality of second lower source-drain regions, the plurality of first lower source-drain regions being doped with one of an n-type dopant and a p-type dopant, the plurality of second lower source drain regions being doped with an opposite one of the n-type dopant and the p-type dopant, the plurality of first lower source drain regions and the plurality of second lower source drain regions having coplanar outer surfaces;

a first plurality of bottom junctions extending from the outer surfaces of the plurality of first lower source-drain regions;

a second plurality of bottom junctions extending from the outer surfaces of the plurality of second lower source-drain regions;

a first plurality of fins located on the first plurality of bottom junctions, the first plurality of fins having outer ends;

a second plurality of fins located on the second plurality of bottom junctions, and, cooperatively with the first plurality of fins, defining intermediate cavities, the second plurality of fins having outer ends, the intermediate cavities extending into the plurality of first lower source drain regions and the plurality of second lower source-drain regions;

a plurality of spacer-gate structures located in the intermediate cavities, the plurality of spacer-gate structures including lower spacers of dielectric material having a depth $t_s$, and the first and second pluralities of bottom junctions extending outward from the plurality of first lower source drain regions and the plurality of second lower source-drain regions by a distance RIE, such that a lower junction-channel proximity x is given by $x=t_s-RIE$, the plurality of spacer-gate structures further including: gates outward of the lower spacers, and upper spacers outward of the gates, the lower junction-channel proximity being defined between outer surfaces of the bottom junctions and inner edges of the gates;

a first plurality of top junctions located on the outer ends of the first plurality of fins;

a second plurality of top junctions located on the outer ends of the second plurality of fins;

a plurality of first upper source-drain regions located outwardly of the plurality of spacer-gate structures in contact with the first plurality of top junctions, the plurality of first upper source-drain regions being doped with the one of an n-type dopant and a p-type dopant; and a plurality of second upper source-drain regions located outwardly of the plurality of spacer-gate structures in contact with the second plurality of top junctions, the plurality of second upper source-drain regions being doped with the opposite one of the n-type dopant and the p-type dopant; and cooperatively specifying, within the design structure, the spacer thickness $t_s$ and the distance RIE, such that the lower junction-channel proximity results in adequate performance with parasitic capacitance less than a predetermined value and dielectric breakdown greater than a predetermined value.

12. The method of claim 11, further comprising providing the design structure to a foundry over a network.

13. The method of claim 11, further comprising fabricating an integrated circuit in accordance with the design structure.

* * * * *